(12) United States Patent
Kim

(10) Patent No.: US 8,873,300 B2
(45) Date of Patent: Oct. 28, 2014

(54) SEMICONDUCTOR MEMORY DEVICE AND METHOD OF OPERATING THE SAME

(71) Applicant: SK hynix Inc., Icheon-si (KR)

(72) Inventor: Tae Hoon Kim, Icheon-si (KR)

(73) Assignee: SK Hynix Inc., Icheon-Si (KR)

(*) Notice: Subject to any disclaimer, the term of this patent is extended or adjusted under 35 U.S.C. 154(b) by 127 days.

(21) Appl. No.: 13/716,412

(22) Filed: Dec. 17, 2012

(65) Prior Publication Data

US 2014/0063984 A1 Mar. 6, 2014

(30) Foreign Application Priority Data

Aug. 29, 2012 (KR) ........................ 10-2012-0095123

(51) Int. Cl.
*G11C 11/34* (2006.01)
*G11C 11/56* (2006.01)
*G11C 7/00* (2006.01)

(52) U.S. Cl.
CPC *G11C 7/00* (2013.01); *G11C 11/56* (2013.01); *G11C 11/5628* (2013.01)
USPC ............ 365/185.24; 365/185.18; 365/185.03; 365/185.19

(58) Field of Classification Search
CPC ....... G11C 11/56; G11C 11/5628; G11C 7/00
USPC .............. 365/185.24, 185.18, 185.19, 185.03
See application file for complete search history.

(56) References Cited

U.S. PATENT DOCUMENTS

| 7,120,051 | B2 * | 10/2006 | Gorobets et al. | 365/185.02 |
| 7,345,928 | B2 * | 3/2008 | Li | 365/189.05 |
| 7,447,078 | B2 * | 11/2008 | Li | 365/185.21 |
| 7,499,320 | B2 * | 3/2009 | Li | 365/185.03 |
| 8,310,870 | B2 * | 11/2012 | Dutta et al. | 365/185.03 |
| 8,472,280 | B2 * | 6/2013 | Li | 365/238.5 |
| 8,473,809 | B2 * | 6/2013 | Wan et al. | 714/763 |
| 8,566,671 | B1 * | 10/2013 | Ye et al. | 714/764 |
| 2012/0155166 | A1 * | 6/2012 | Li | 365/185.03 |
| 2014/0059406 | A1 * | 2/2014 | Hyun et al. | 714/773 |
| 2014/0063939 | A1 * | 3/2014 | Marcu et al. | 365/185.03 |
| 2014/0153332 | A1 * | 6/2014 | Parthasarathy et al. | 365/185.09 |

FOREIGN PATENT DOCUMENTS

| KR | 100778082 B1 | 11/2007 |
| KR | 1020080029758 A1 | 4/2008 |
| KR | 1020080090772 A | 10/2008 |

* cited by examiner

*Primary Examiner* — Viet Q Nguyen
(74) *Attorney, Agent, or Firm* — Haynes and Boone, LLP

(57) ABSTRACT

A semiconductor memory device is provided. The semiconductor memory device includes memory cells having first to fourth middle states corresponding to different threshold voltage distributions. The semiconductor memory device also includes a peripheral circuit configured to perform a first program operation to program memory cells having the third and the fourth middle states to have four upper states and perform a second program operation to program memory cells having the first and the second middle states to have another four upper states.

18 Claims, 7 Drawing Sheets

SEMICONDUCTOR MEMORY DEVICE AND METHOD OF OPERATING THE SAME

CROSS-REFERENCE TO RELATED APPLICATION

This application claims priority from Korean Patent Application No. 10-2012-0095123, filed on Aug. 29, 2012, the contents of which are incorporated herein by reference in its entirety.

BACKGROUND

A semiconductor memory device is provided. A semiconductor memory device is a memory device embodied by using a semiconductor such as silicon Si, germanium Ge, gallium arsenide GaAs, indium phosphide Inp, etc. Typically, a semiconductor memory device may be either a volatile memory device or a non-volatile memory device.

A volatile memory device is a memory device where stored data becomes lost if power is not supplied. Examples of volatile memory devices include a static RAM (SRAM), a dynamic RAM (DRAM), a synchronous DRAM (SDRAM) and so on. A non-volatile memory device is a memory device where stored data remains even when power is not supplied. Examples of non-volatile memory devices include read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), etc. Flash memory, which may be the most common and well-known non-volatile memory device, includes a NOR-type memory device and a NAND-type memory device.

Semiconductor memory devices typically includes memory cells that each store at least one data bit. Semiconductor memory devices may include single level cells or mufti-level cells. A single level cell stores one data bit, and mufti level cells store two or more data bits.

Semiconductor memory devices typically also include one or more peripheral circuits for driving the memory cells. However, as the number of data bits stored in each memory cell increases, the design of the one or more peripheral circuits becomes more complex. For example, the design of the peripheral circuit when three data bits are stored in one memory cell is more complex than that of the peripheral circuit when two data bits are stored in one memory cell, and area of the peripheral circuit when three data bits are stored in one memory cell is higher than that of the peripheral circuit when two data bits are stored in one memory cell.

BRIEF SUMMARY

Embodiments described herein may provide a semiconductor memory device having a reduced area.

Consistent with some embodiments, there is also provided a method of operating a semiconductor memory device including memory cells having a first to fourth middle states corresponding to different threshold voltage distributions. The method includes performing a first sub program so that memory cells having the third and the fourth middle states have four upper states, and performing a second sub program so that memory cells having the first and the second middle states have another four upper states.

According to some embodiments, the first to the fourth middle states may be defined in an order of a level of a corresponding threshold voltage distribution.

Consistent with some embodiments, there is also provided a semiconductor memory device. The semiconductor memory device includes memory cells having first to fourth middle states corresponding to different threshold voltage distributions. The semiconductor memory device also includes a peripheral circuit configured to perform a first sub program operation to program memory cells having the third and the fourth middle states to have four upper states and perform a second sub program operation to program memory cells having the first and the second middle states to have another four upper states.

BRIEF DESCRIPTION OF THE DRAWINGS

Embodiments consistent with this disclosure are described with reference to the following detailed description when considered in conjunction with the accompanying drawings wherein.

DETAILED DESCRIPTION

In the following description specific details are set forth describing certain embodiments. It will be apparent, however, to one skilled in the art that the disclosed embodiments may be practiced without some or all of these specific details. The specific embodiments presented are meant to be illustrative, but not limiting. One skilled in the art may realize other material that, although not specifically described herein, is within the scope and spirit of this disclosure.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Figure 1:
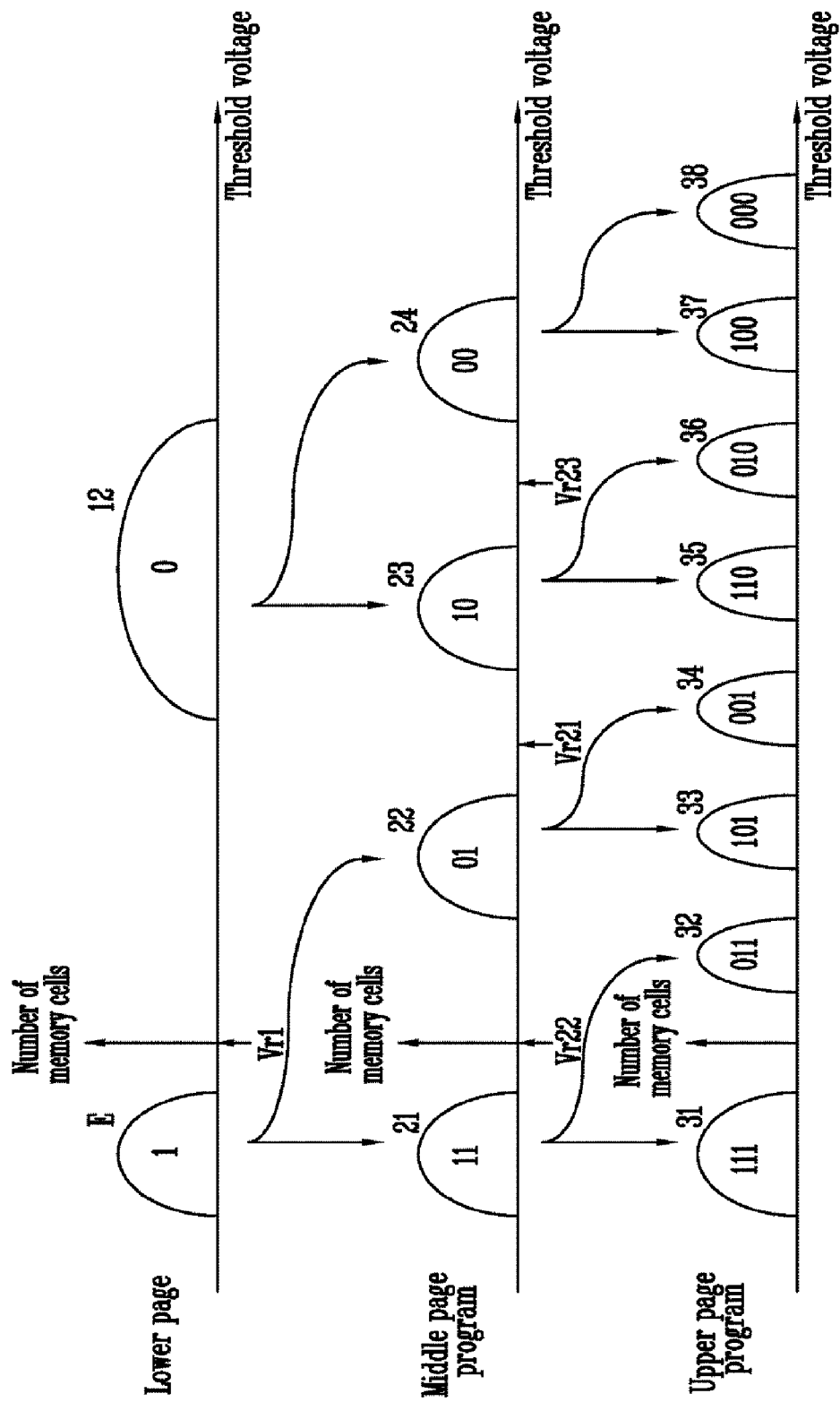
FIG. 1 is a diagram illustrating change of threshold voltage distribution when a middle page program and an upper page program are performed about memory cells.

FIG. 1 is a diagram illustrating a change of threshold voltage distribution when a middle page program and an upper page program are performed on memory cells. In FIG. 1, the horizontal axis is the threshold voltage, and the vertical axis is the number of memory cells.

In FIG. 1, in the event that a single data bit is stored in each of memory cells, the memory cells have erase state E and second lower state 12. For example, the memory cell having the erase state E stores "1", and the memory cell having the second lower state 12 stores "0".

A read operation on the memory cells may be first performed in the middle page program. For example, data stored in the memory cells is read on the basis of a first read voltage Vr1. It is detected through the read data whether each of the memory cells corresponds to the erase state E or the second lower state 12.

The middle page program may be performed based on the detected result. The memory cells having the erase state E are programmed to erase state 21 (hereinafter, referred to as first middle state) and a second middle state 22. The memory cells having the second lower state 12 are programmed to a third middle state 23 and a fourth middle state 24.

For example, as shown in FIG. 1, a memory cell having the first middle state 21 stores data "11", a memory cell having the second middle state 22 stores data "01", a memory cell having the third middle state 23 stores data "10", and a memory cell having the fourth middle state 24 stores data "00". That is, the memory cell having the first middle state 21 stores lower data bit "1" and upper data bit "1". The memory cell having the second middle state 22 stores lower data bit "1" and upper data bit "0". The memory cell having the third middle state 23 stores lower data bit "0" and upper data bit "1". The memory cell having the fourth middle state 24 stores lower data bit "0" and upper data bit "0".

Consistent with some embodiments, a program operation includes increasing threshold voltages of memory cells to be programmed by supplying a program pulse to a selected word line, verifying whether the threshold voltages of the memory cells to be programmed correspond to desired states, and increasing the threshold voltages of the memory cells to be programmed by supplying an increased program pulse to the selected word line according to the result of verification. When the program pulse is supplied, a ground voltage may also be supplied to bit lines corresponding to the memory cells to be programmed (for example, memory cells of which threshold voltages increase because the memory cells are programmed from the erase state to the second middle state), and a program inhibition voltage which may be a supply voltage may also be supplied to bit lines corresponding to memory cell of which programming is inhibited (for example, memory cells to be have the first middle state corresponding to the erase state). The program operation may, thus, the program the memory cells to have desired states.

The upper page program is performed after the middle page program is completed. When the upper page program is performed, a read operation of the memory cells may first be performed. For example, a read operation may determine whether a lower data bit stored in each of the memory cells is a "1" or "0" using a first read voltage Vr21. The read operation may then determine whether an upper data bit stored in each of the memory cells is a "1" or "0" using a second read voltage Vr22 and a third read voltage Vr23. As a result, the read operation of the memory cells may determine whether each of the memory cells has any state of the first middle state 21 to the fourth middle state 24. Based on this determination, the upper page program may be performed.

For example, the memory cells having the first middle state 21 are programmed to have erase state 31 (hereinafter, referred to as first upper state) and a second upper state 32. The memory cells having the second middle state 22 are programmed to have a third upper state 33 and a fourth upper state 34. The memory cells having the third middle state 23 are programmed to have a fifth upper state 35 and a sixth upper state 36. The memory cells having the fourth middle state 24 are programmed to have a seventh upper state 37 and an eighth upper state 38. For example, the first to the eighth upper states correspond to "111", "011", "101", "001", "110", "010", "100" and "000", respectively.

As described above, two data bits are stored in each of the memory cells before the upper page program is performed. That is, the memory cells have four middle states 21 to 24. To detect whether each of the memory cells has any state before the upper page program is performed, a page buffer section corresponding to each of the memory cells should have at least two latches. On the other hand, one data bit is stored in each of the memory cells before the middle page program is performed, such that the memory cells have the erase state E and the second lower state 12. Accordingly, to detect whether each of the memory cells has any state before the middle page program is performed, a page buffer section corresponding to each of the memory cells should have at least one latch.

Consequently and consistent with some embodiments, the number of latches needed in the upper page program is higher than that of the latches needed in the middle page program. Therefore, the number of latches included in the page buffer section corresponding to each of the memory cells increases as the number of data bits stored in each of the memory cells increases.

Figure 2:
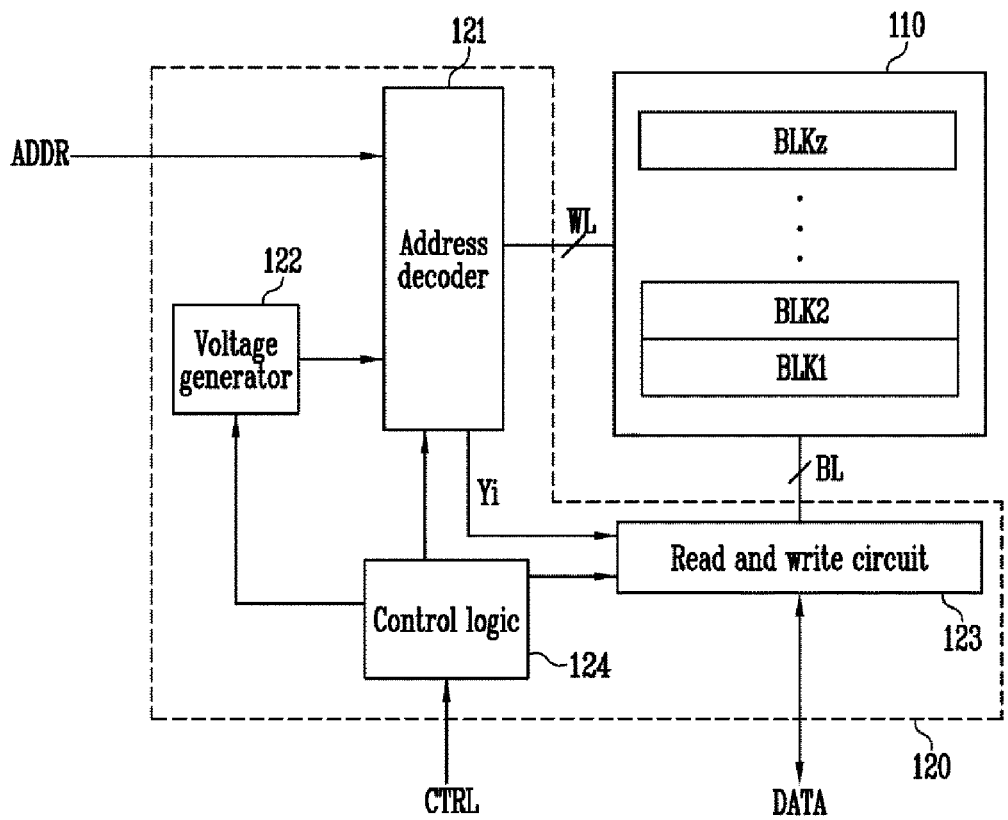
FIG. 2 is a block diagram illustrating a semiconductor memory device.

FIG. 2 is a block diagram illustrating a semiconductor memory device, consistent with some embodiments. As shown in FIG. 2, the semiconductor memory device 100 may include a memory cell array 110 and a peripheral circuit 120 for driving the memory cell array 110. The peripheral circuit includes address decoder 121, voltage generator 122, read and write circuit 123, and control logic 124.

The memory cell array 110 includes memory blocks BLK1~BLKz. The memory blocks BLK1~BLKz are coupled to an address decoder 121 though row lines RL. The memory blocks BLK1~BLKz are coupled to a read and write circuit 123 through bit lines BL. Each of the memory blocks BLK1~BLKz includes memory cells. In an embodiment, the memory cells are non-volatile memory cells.

The address decoder 121 is coupled to the memory cell array 110 through word lines WL. The address decoder 121 operates in response to a controlling signal received from the control logic 124. The address decoder 121 receives an address ADDR from an external device or an input/output buffer (not shown) in the semiconductor memory device. The address decoder 121 decodes a block address of the received address ADDR and selects one or more memory block in response to the decoded block address. The address decoder 121 decodes a row address of the received address ADDR and drives word lines coupled to a selected memory block according to the decoded row address. The address decoder 121 also decodes a column address of the received address ADDR and transmits the decoded column address Yi to the read and write circuit 123.

The programming of the semiconductor memory device 100 is performed in the unit of a page. The address ADDR in a program operation includes the block address, the row address and the column address. The address decoder 121 selects one memory block and one word line according to the block address and the row address. The column address is decoded by the address decoder 121, and the decoded column address is provided to the read and write circuit 122.

Consistent with some embodiments, the address decoder 121 may include a block decoder, a row decoder, a column decoder and an address buffer, etc.

The voltage generator 122 generates voltages using a supply voltage supplied to the semiconductor memory device 100. The voltage generator 122 operates in response to a controlling signal received from the control logic 124. According to some embodiments, the voltage generator 122 may include pumping capacitors, and selectively activate the pumping capacitors to generate the voltages. The generated voltages are supplied to the address decoder 121. The address decoder 121 drives word lines coupled to a selected memory block by using the supplied voltages.

The read and write circuit 123 is coupled to the memory cell array 110 through the bit lines BL. The read and write circuit 123 operates in response to a controlling signal received from the control logic 124.

In the program operation, the read and write circuit 123 exchanges data DATA with an external device or the input/output buffer in the semiconductor memory device 100. The read and write circuit 123 receives data DATA to be programmed in the program operation. The read and write circuit 123 delivers the data DATA to be programmed to bit lines coupled to a selected word line of the bit lines BL whenever a program pulse is provided to the selected word line. The delivered data DATA is programmed to memory cells coupled to the selected word line.

According to some embodiments, the read and write circuit 123 may include page buffers (or page registers), a column select circuit, etc.

The control logic 124 is coupled to the address decoder 121, the voltage generator 122 and the read and write circuit 123. The control logic 124 receives a control signal CTRL from an external device or the input/output buffer in the semiconductor memory device 100. The control logic 124 controls operation of the semiconductor memory device 100 in response to the control signal CTRL.

The semiconductor memory device 100 may further include the input/output buffer (not shown). The input/output buffer may receive the control signal CTRL and the address ADDR from an external device, and deliver the received control signal CTRL and the address ADDR to the control logic 124 and the address decoder 121, respectively. The input/output buffer delivers data DATA received from an external device to the read and write circuit 123, and delivers data DATA received from the read and write circuit 123 to an external device. According to some embodiments, the semiconductor memory device 100 may be a flash memory device.

Figure 3:
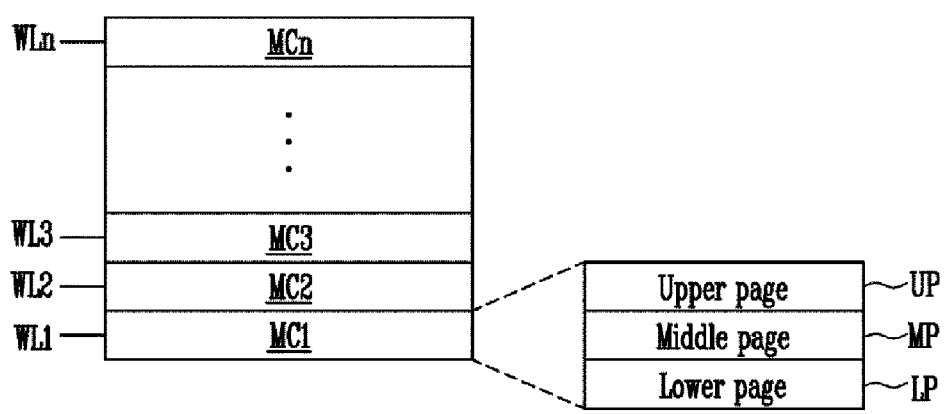
FIG. 3 is a block diagram illustrating one of the memory blocks BLK1~BLKz in FIG. 2.

FIG. 3 is a block diagram illustrating one of the memory blocks BLK1~BLKz in FIG. 2. As shown in FIG. 3, the memory block BLK1 is coupled to a first to an nth word lines WL1~WLn. The first to the nth word lines WL1~WLn are included in the word lines WL in FIG. 1.

The memory block BLK1 includes a first to an nth memory cell groups MC1~MCn. Consistent with some embodiments, memory cells coupled to one word line forms one group. Memory cells coupled to a first word line WL1 form a first memory cell group MC1. Memory cells coupled to a second word line WL2 form a second memory cell group MC2. Memory cells coupled to a third word line WL3 form a third memory cell group MC3. Memory cells coupled to the nth word line WLn form an nth memory cell group MCn.

Memory cell groups MC1-MCn may include pages. For example, a first memory cell group MC1 is shown in FIG. 3 as including three pages: a lower page (LP); a middle page (MP); and an upper page (UP). The lower page LP may include lower data bits stored in a corresponding memory cell group. The middle page MP may include middle data bits stored in a corresponding memory cell group. The upper page UP may include upper data bits stored in a corresponding memory cell group.

Figure 4:
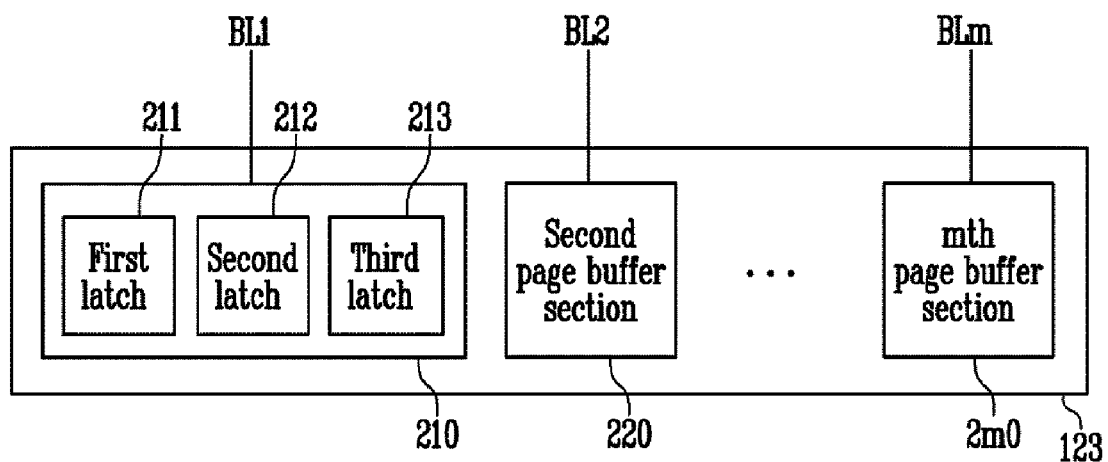
FIG. 4 is a block diagram illustrating the read and write circuit 123 in FIG. 2.

FIG. 4 is a block diagram illustrating the read and write circuit 123 in FIG. 2. As shown in FIG. 4, the read and write circuit 123 may include first to an mth page buffer sections 210~2m0. The first to the mth page buffer sections 210~2m0 are coupled to a first to an mth bit lines BL1~BLm, respectively. The first to the mth bit lines BL1~BLm are may correspond to the bit lines BL in FIG. 2.

As shown in FIG. 4, first page buffer section 210 includes a first latch 211, a second latch 212, and a third latch 213. Although only the first page buffer section 210 is shown as including latches, consistent with some embodiments, each of the page buffer sections 220-2m0 also include a plurality of latches as the first page buffer section 210.

Consistent with some embodiments, the program operation of the semiconductor memory device 100 is performed by using the latches 211~21r. For example, in the middle page program (in FIG. 1), data to be programmed may be stored in a first latch 211, and lower data bit read from the corresponding memory cell may be stored in a third latch 213. The middle state of the corresponding memory cell to be programmed from the middle states 21 to 24 shown in FIG. 1 is specified according to data of the first latch 211 and data of the second latch 213. In the program operation, a program inhibition voltage or a supply voltage is supplied to corresponding bit line BL1 according to the data stored in the first latch 211. As a result, the threshold voltage of corresponding memory cell is maintained or increased. In a verify operation, data corresponding to the threshold voltage of the memory cells is stored in a second latch 212, the data stored in the second latch 212 is compared with the data stored in the first latch 211 and the lower data bit stored in the third latch 213, and, based on this comparison it is verified whether the threshold voltage of the memory cell corresponds to desired middle state.

Figure 5:
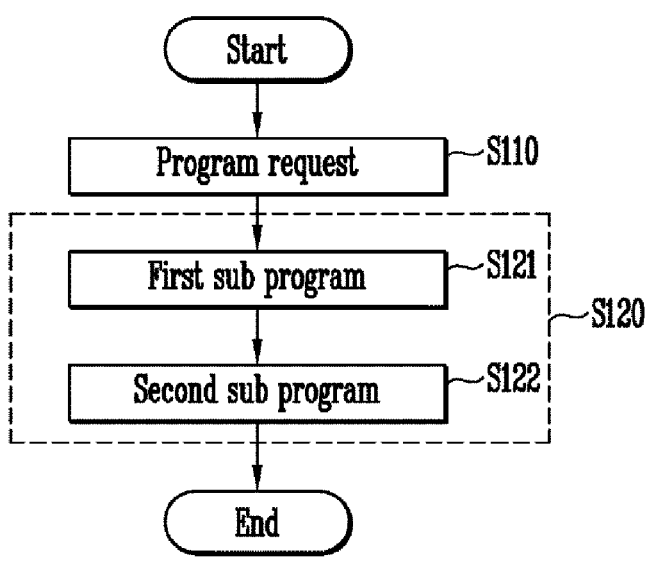
FIG. 5 is a flowchart illustrating an upper page program according to some embodiments.

FIG. 5 is a flowchart illustrating a method for performing an upper page program according to some embodiments. For the purpose of illustration, the method shown in the flowchart of FIG. 5 will be discussed with reference to FIG. 2. As shown in FIG. 5, a program request is received by the semiconductor memory device 100 in step S110. Consistent with some embodiments, receiving a program request may include receiving the control signal CTRL, the address ADDR and data to be programmed. For the purpose of discussion, the upper page program performed in accordance with the method shown in FIG. 5 will be assumed to be performed after a middle page program has been performed.

In step S120, an upper page program is performed. The upper page program includes a first sub program S121 and a second sub program S122. The first subprogram S121 and second subprogram S122 will be discussed with respect to FIGS. 6-8.

Figure 6:
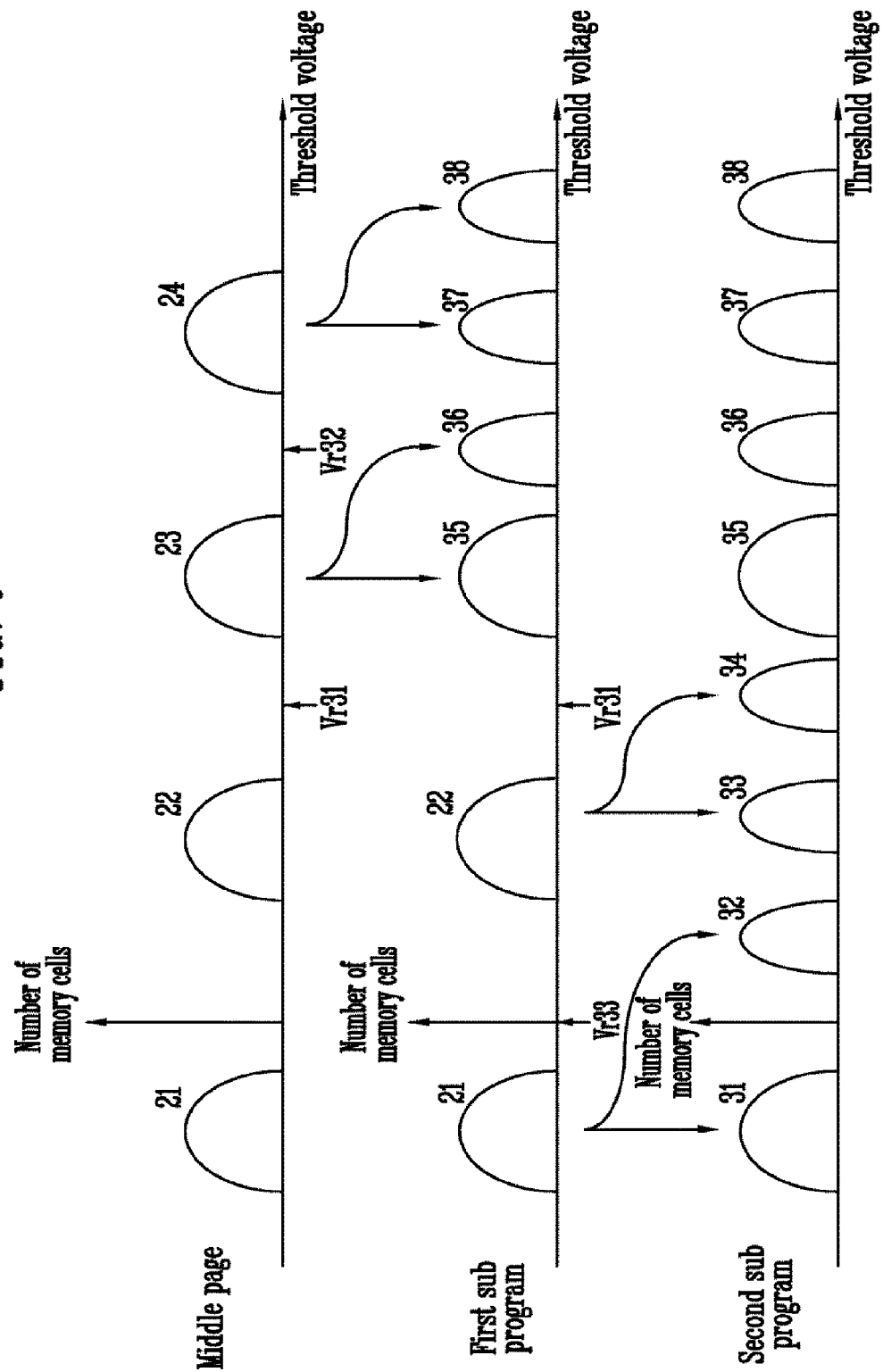
FIG. 6 is a diagram illustrating threshold voltage distribution when the upper page program in FIG. 5 is performed.
Figure 7:
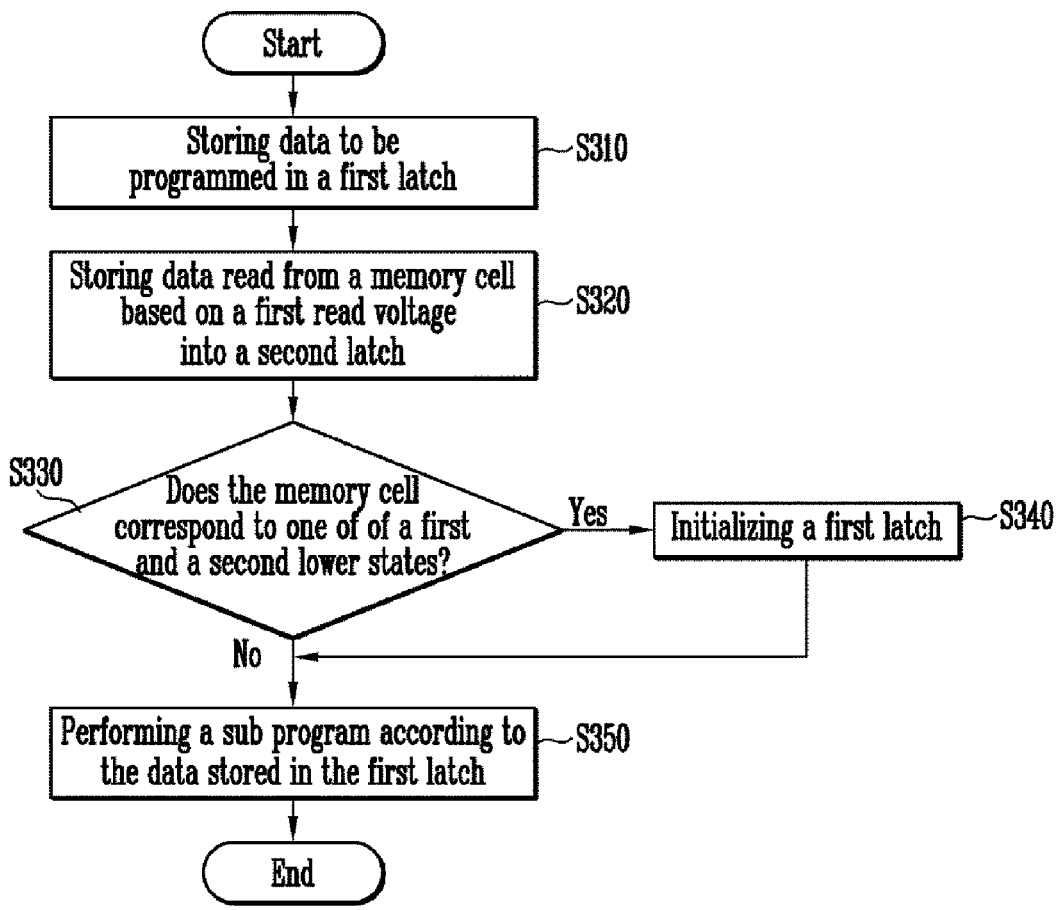
FIG. 7 is a flowchart illustrating a method of performing a first sub program according to some embodiments.
Figure 8:
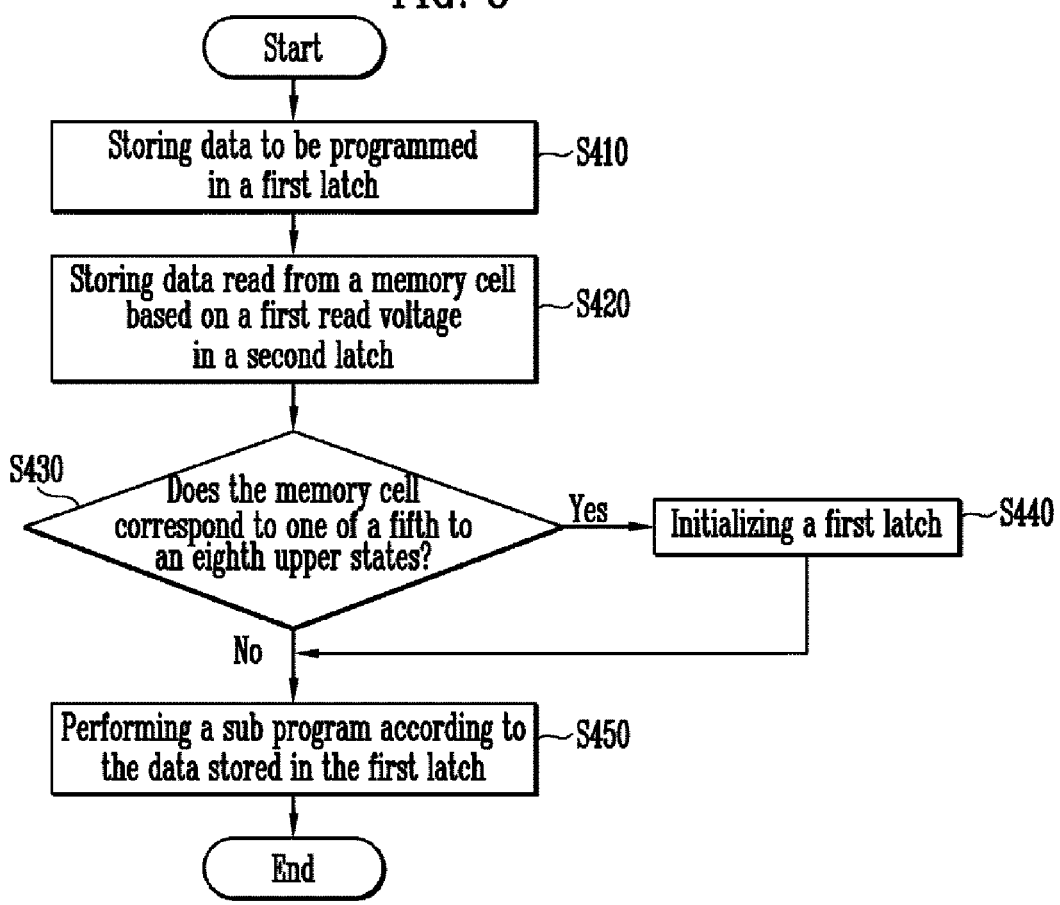
FIG. 8 is a flowchart illustrating a method of performing a second sub program according to some embodiments.

FIG. 6 is a diagram illustrating threshold voltage distribution when the upper page program in FIG. 5 is performed. FIG. 7 is a flowchart illustrating a method of performing a first sub program according to some embodiments. FIG. 8 is a flowchart illustrating a method of performing a second sub program according to some embodiments.

As shown in FIG. 6, each of the memory cells stores two data bits before the first sub program is performed. The memory cells have the first to the fourth middle states 21 to 24. When the first sub program is performed, memory cells having third middle state 23 are programmed to fifth upper state 35 and sixth upper state 36, and memory cells having fourth middle state 24 are programmed to seventh upper state 37 and eighth upper state 38.

In the first sub program, memory cells having first middle state 21 and second middle state 22 are not programmed. That is, programming of the memory cells having the first and the second middle states 21 and 22 is inhibited. When the first sub program is completed, the memory cells have the first and the second middle states 21 and 22 and the fifth to the eighth upper states 35 to 38, as is shown in FIG. 6.

Referring now to FIG. 7, which will be discussed with reference to FIG. 4 and FIG. 6, data to be programmed is stored in each of the page buffer sections when the first sub program is performed in step S310. Consistent with some embodiments, the data to be programmed is stored in a first latch 211. In step S320, data in a corresponding memory cell is read based on a first read voltage Vr31, and the read data is stored in the second latch 212. In step S330, a determination is made as to whether the memory cell corresponds to one of the first and the second middle states 21 and 22 or one of the third and the fourth middle states 23 and 24.

If it is determined that the memory cell corresponds to one of the first and second middle states 21 and 22, the first latch 211 where data to be programmed is stored is initialized in step S340. If it is determined that the memory cell does not correspond to one of the first and second middle states 21 and 22, in step S350, the first sub program is performed according to the data stored in the first latch 211. If the first latch 211 is initialized, for example as described with reference to step S340, a program inhibition voltage is supplied to corresponding bit line BL1, and to inhibit programming of the memory cell. If first latch 211 maintains data, a program inhibition voltage or a supply voltage is supplied to a corresponding bit line according to the data stored in the first latch 211, and thus threshold voltage of the memory cell is maintained or increased. Consistent with some embodiments, the first subprogram illustrated in FIG. 7 programs the memory cells having the third and fourth middle states 23 and 24 may be programmed without also programming the memory cells having the first and second middle states 21 and 22.

Referring back to FIG. 6, the second sub program is performed after the first sub program is completed. When the second sub program is performed, the memory cells having the first middle state 21 are programmed to erase state 31 (hereinafter, referred to as first upper state) and second upper state 32, and the memory cells having the second middle state 22 are programmed to third upper state 33 and fourth upper state 34. In the second sub program, threshold voltages of memory cells having fifth to eighth upper states 35 to 38 are maintained.

Referring now to FIG. 8, which will be described with reference to FIGS. 4 and 6, data to be programmed is again loaded in the first latch 211 of each of the page buffer sections when the second sub program is performed in step S410. In step S420, data of a corresponding memory cell is read based on a first read voltage Vr31, and the read data is stored in the second latch 212. In step S430, it is determined whether the memory cell has a threshold voltage higher than the first read voltage Vr31 or a threshold voltage lower than the first read voltage Vr31, according to the read data. If the memory cell has a threshold voltage higher than the first read voltage Vr31, the memory cell corresponds to one of the fifth to the eighth upper states 35 to 38. However, if the memory cell has the threshold voltage lower than the first read voltage Vr31, the memory cell corresponds to one of the first and the second middle states 21 and 22. If the determination in step S430 determines that the memory cell corresponds to one of a fifth to an eighth upper states, that is that the memory cell has a threshold voltage higher than the first read voltage Vr31, the first latch 211 where the data is stored is initialized in step S440. If the determination in step S430 determines that the memory cell does not correspond to one of a fifth to an eighth upper states, that is that the memory cell has a threshold voltage lower than the first read voltage Vr31, the second sub program is performed according to the data stored in the first latch 211, in step S450. After the second sub program is completed, the memory cells may include the first to the eight upper states 31 to 38.

Consistent with some embodiments, the upper page program is performed according to the first sub program, shown in FIG. 7, and the second sub program, shown in FIG. 8. By performing an upper page program according to FIGS. 5-8, the number of latches required in the read and write circuit 123 may be reduced in comparison to conventional attempts that would program the first to the fourth middle states 21 to 24 to the first to the eight upper states 31 to 38 one at a time. Further, by reducing a number of latches, an area of the semiconductor memory device 100 may also be reduced.

In the embodiments in FIG. 5 to FIG. 8, the memory cells having the first and the second middle states 21 and 22 are programmed after the memory cells having the third and the fourth middle states 23 and 24 are programmed. However, according to some embodiments, the memory cells having the third and the fourth middle states 23 and 24 may be programmed after the memory cells having the first and the second middle states 21 and 22 are programmed.

Figure 9:
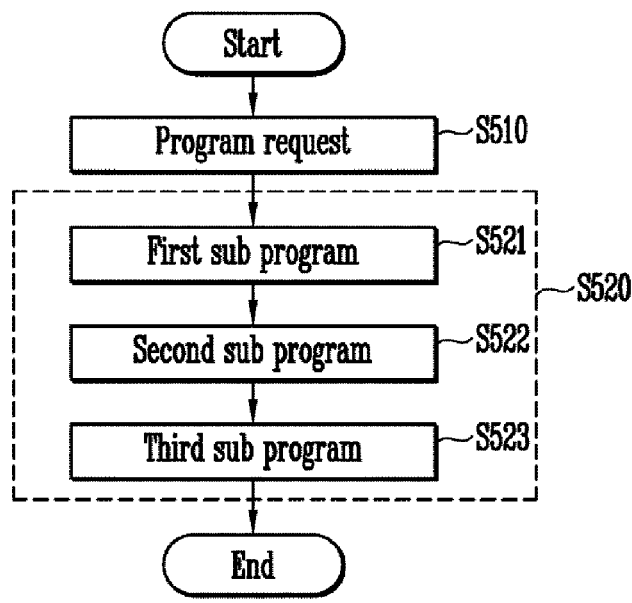
FIG. 9 is a flowchart illustrating a method of performing an upper page program according to some embodiments.

FIG. 9 is a flowchart illustrating a method of performing an upper page program according to some embodiments. As shown in FIG. 9, a program request is received by the semiconductor memory device 100 in step S510. Consistent with some embodiments, receiving a program request may include receiving the control signal CTRL, the address ADDR and the data DATA to be programmed. For the purpose of discussion, the upper page program performed according to FIG. 9 will be assumed to be performed after a middle page program has been performed.

In step S520, the upper page program is performed. Consistent with some embodiments, the upper page program includes a first to a third sub programs S521 to S523.

Figure 10:
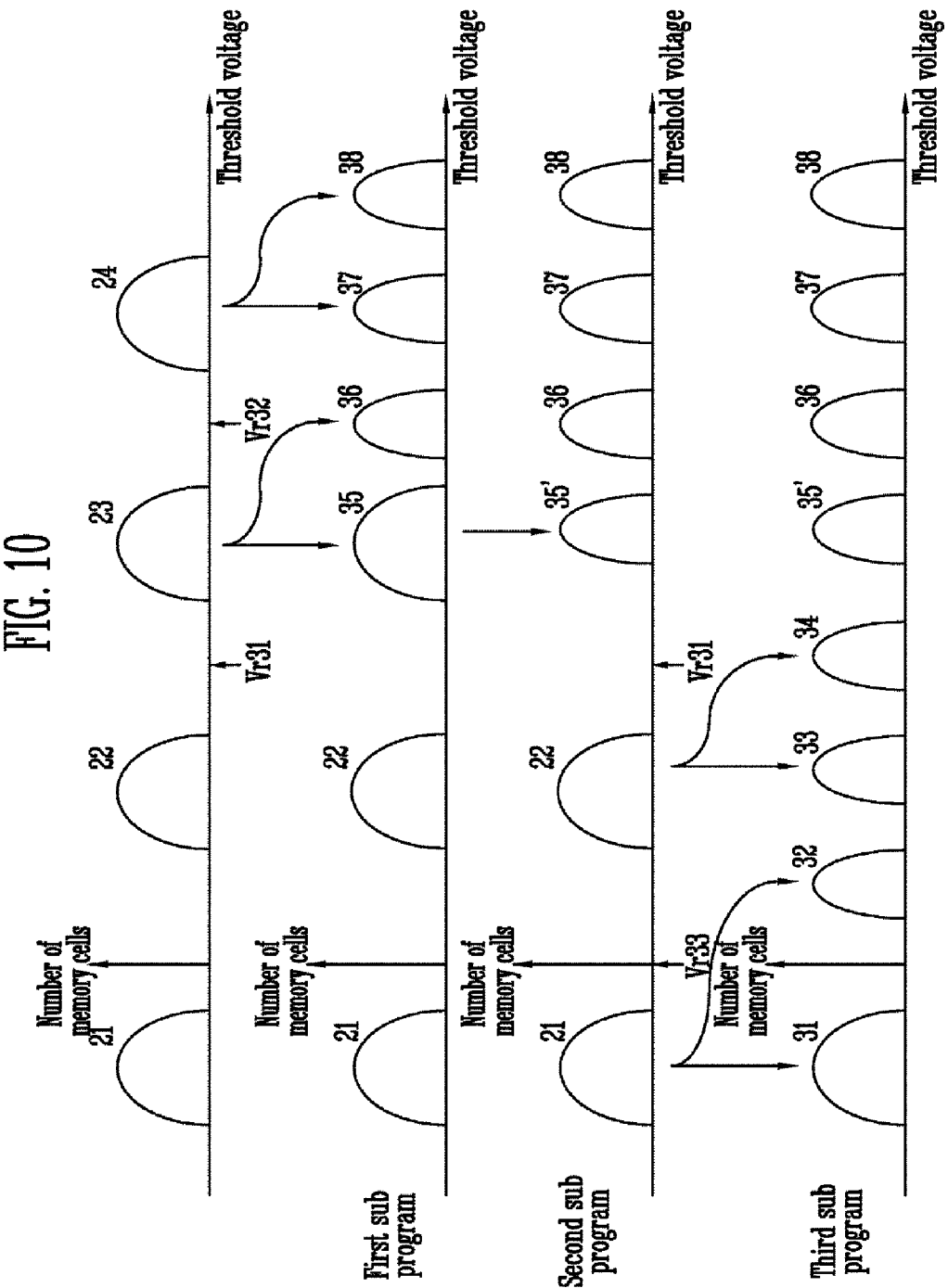
FIG. 10 is a diagram illustrating threshold voltage distribution when an upper page program in FIG. 9 is performed according to some embodiments.

FIG. 10 is a diagram illustrating threshold voltage distribution when an upper page program in FIG. 9 is performed according to some embodiments. In FIG. 10, the first sub program is initially performed. Consistent with some embodiments, the first sub program in FIG. 10 is performed similarly to the first sub program in FIG. 6.

A second sub program may further be performed to narrow a threshold voltage distribution of the fifth upper state 35 after the first sub program is performed. Consistent with some embodiments, when the upper page program is performed, three data bits are stored in each of the memory cells. To secure the read margin, threshold voltage distributions of the first to the eight upper states 31 to 38 should be narrower than those of the first to the fourth middle states 21 to 24. Since the memory cells programmed to the fifth upper state 35 correspond to memory cells of the third state 23, to which programming is inhibited, threshold voltage distribution of the fifth upper state 35 may be substantially identical to that of the third middle state 23.

Consistent with some embodiments, a second sub program may be further performed to program the memory cells having the fifth upper state 35 to a ninth upper state 35' having a threshold voltage distribution narrower than the fifth upper state 35. A third sub program may then be performed after the second sub program is completed. The third sub program may be similar to the second sub program described with respect to FIG. 6.

Although in FIG. 10, the second sub program is performed after the first sub program is completed and before the third sub program is performed, the order of the first sub program to the third sub program is not limited, and may be variously modified. For example, the second sub program may be performed after the first and the third sub programs are performed.

Embodiments as described herein may provide a method of performing an upper page program, wherein the upper page is programmed by performing a plurality of sub-programs. As a result, the number of latches in the read and write circuit may be reduced which may, in turn, reduce an area of the semiconductor memory device may.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:

1. A method of operating a semiconductor memory device including memory cells having a first to fourth middle states corresponding to different threshold voltage distributions, the method comprising:
    performing a first sub program so that memory cells having the third and the fourth middle states have four upper states; and
    performing a second sub program so that memory cells having the first and the second middle states have another four upper states.

2. The method of claim 1, wherein the first to the fourth middle states are defined in an order of a level of a corresponding threshold voltage distribution.

3. The method of claim 2, wherein:
    the another four upper states comprise a first to a fourth upper states, and the four upper states comprise a fifth to an eighth upper states; and
    the first to the eighth upper states are defined in an order of a level of a corresponding threshold voltage distribution.

4. The method of claim 3, wherein performing the first sub program comprises programming the memory cells having the third middle state to have the fifth and the sixth upper states and programming memory cells having the fourth middle state to have the seventh and the eighth upper states.

5. The method of claim 4, further comprising:
    performing a third sub program to narrow the threshold voltage distribution of the fifth upper state.

6. The method of claim 3, wherein performing the second sub program comprises programming memory cells having the first middle state to have the first and the second upper states and programming memory cells having the second middle state to have the third and the fourth upper states.

7. The method of claim 1, wherein the third middle state, the fourth middle state, the first middle state and the second middle state are defined in an order of a level of a corresponding threshold voltage distribution.

8. The method of claim 1, further comprising:
    performing a lower page program to program the memory cells to have a first and a second lower states; and
    performing a middle page program to program the memory cells having the first and the second lower states to have the first to the fourth middle states.

9. The method of claim 8, wherein performing the lower page program comprises performing the lower page program when the memory cells have an erase state.

10. A semiconductor memory device comprising:
    memory cells, the memory cells having first to fourth middle states corresponding to different threshold voltage distributions; and
    a peripheral circuit configured to:
        perform a first sub program operation to program memory cells having the third and the fourth middle states to have four upper states; and
        perform a second sub program operation to program memory cells having the first and the second middle states to have another four upper states.

11. The semiconductor memory device of claim 10, wherein the first to the fourth middle states are defined in an order of a level of a corresponding threshold voltage distribution.

12. The semiconductor memory device of claim 11, wherein the another four upper states comprise first to fourth upper states, and the four upper states comprise fifth to eighth upper states,
    and wherein the first to eighth upper states are defined in an order of a level of a corresponding threshold voltage distribution.

13. The semiconductor memory device of claim 12, wherein in the first sub program operation, the peripheral circuit is configured to program memory cells having the third middle state to have the fifth and the sixth upper states and to program memory cells having the fourth middle state to have the seventh and the eighth upper states.

14. The semiconductor memory device of claim 13, wherein the peripheral circuit is further configured to perform a third sub program operation for narrowing threshold voltage distribution of the fifth upper state.

15. The semiconductor memory device of claim 12, wherein in the second sub program operation, the peripheral circuit is configured to program memory cells having the first middle state to have the first and the second upper states and to program memory cells having the second middle state to have the third and the fourth upper states.

16. The semiconductor memory device of claim 10, wherein the peripheral circuit is further configured to perform a lower page program to program the memory cells to have first and second lower states.

17. The semiconductor memory device of claim 16, wherein the peripheral circuit is further configured to perform a middle page program to program the memory cells having the first and the second lower states to have the first to the fourth middle states.

18. The semiconductor memory device of claim 17, wherein the peripheral circuit performs the lower page program when the memory cells have an erase state.

* * * * *